(12) United States Patent
Mizushima et al.

(10) Patent No.: US 6,278,180 B1
(45) Date of Patent: Aug. 21, 2001

(54) BALL-GRID-ARRAY-TYPE SEMICONDUCTOR DEVICE AND ITS FABRICATION METHOD AND ELECTRONIC DEVICE

(75) Inventors: Kiyoshi Mizushima; Makoto Aoki; Satoshi Ikeda; Noriyuki Tanagi, all of Matto (JP)

(73) Assignee: Nikko Company, Ishikawa-ken (JP)

( * ) Notice: Subject to any disclaimer, the term of this patent is extended or adjusted under 35 U.S.C. 154(b) by 0 days.

(21) Appl. No.: 09/066,876

(22) Filed: Apr. 28, 1998

(30) Foreign Application Priority Data

Jun. 4, 1997 (JP) .................................................. 9-146314

(51) Int. Cl.[7] .................................................. H01L 23/12
(52) U.S. Cl. ........................... 257/700; 257/780; 257/738
(58) Field of Search ........................... 257/779, 780, 257/738, 700, 778, 786, 737, 772

(56) References Cited

U.S. PATENT DOCUMENTS

| | | | |
|---|---|---|---|
| 5,477,419 | * 12/1995 | Goodman et al. | 361/760 |
| 5,591,941 | * 1/1997 | Acocella et al. | 174/266 |
| 5,666,008 | * 9/1997 | Tomita et al. | 257/778 |
| 5,821,627 | * 10/1998 | Mori et al. | 257/780 |
| 5,998,861 | * 12/1999 | Hiruta | 257/700 |

FOREIGN PATENT DOCUMENTS

| | | | |
|---|---|---|---|
| 62/00686 | * 1/1987 | (JP) | 257/779 |
| 8-031974 | 2/1996 | (JP) | . |
| 9-134934 | 5/1997 | (JP) | . |
| WO88/08009 | 10/1988 | (WO) | . |
| WO92/02039 | 2/1992 | (WO) | . |

OTHER PUBLICATIONS

Denshizairyo, Apr. 1997, pp. 103–105 and English translation.

* cited by examiner

Primary Examiner—Matthew Smith
Assistant Examiner—Victor Yevsikov
(74) Attorney, Agent, or Firm—Mattingly, Stanger & Malur, P.C.

(57) ABSTRACT

A ball-grid-array-type semiconductor device comprising a package substrate constituted with a ceramic wiring board having a semiconductor chip mounting portion on the principal plane and electrodes arranged like an array on the back, a semiconductor chip secured to the principal plane of the package substrate, connection means for electrically connecting the electrodes of the semiconductor chip with the wiring of the wiring board, a sealing body provided for the principal plane side of the wiring board and made of an insulating resin to cover the semiconductor chip and the connection means, a pedestal layer made of low-fusion-point solder and formed on the electrodes, and a metallic ball secured onto the pedestal layer; wherein a buffering layer made of high-fusion-point solder which covers the entire surface of the electrodes and whose margin extends up to a predetermined length on the back of the package substrate is formed on the electrodes and the pedestal layer is formed on the buffering layer.

10 Claims, 7 Drawing Sheets

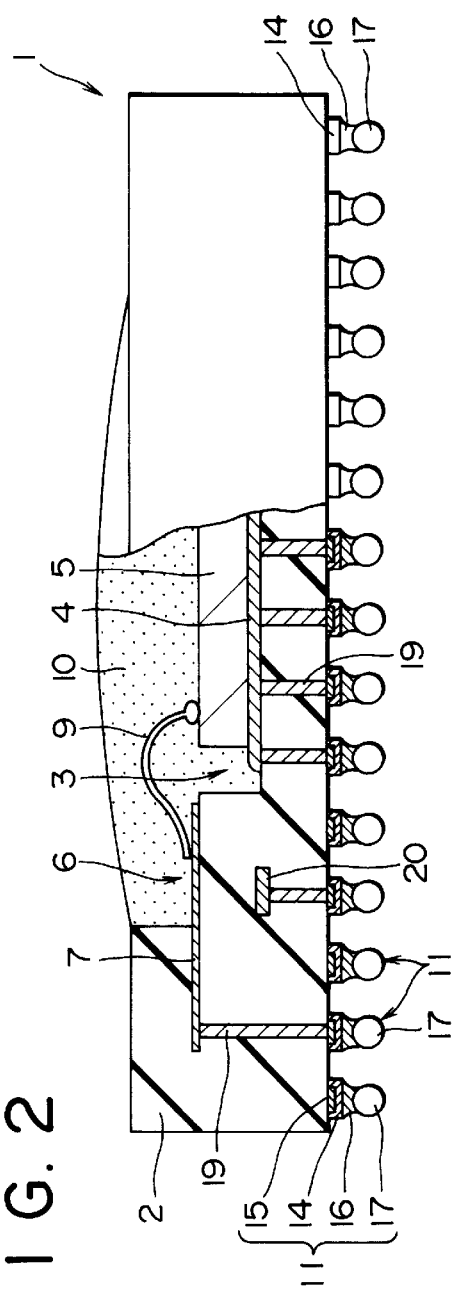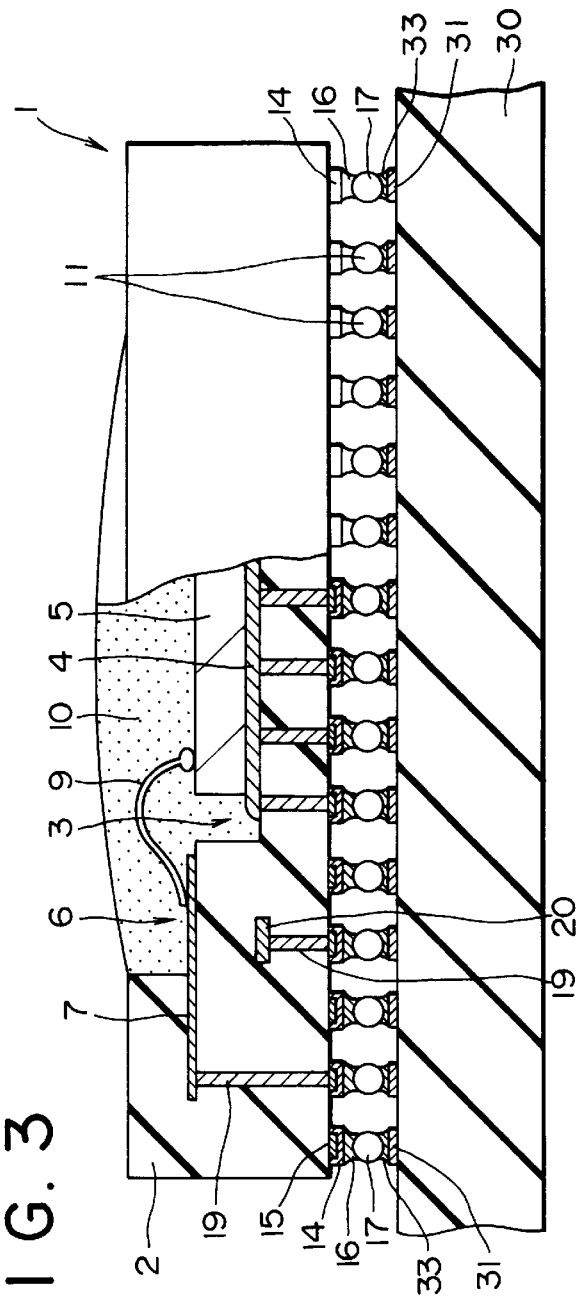

BALL-GRID-ARRAY-TYPE SEMICONDUCTOR DEVICE AND ITS FABRICATION METHOD AND ELECTRONIC DEVICE

BACKGROUND OF THE INVENTION

The present invention relates to a ball-grid-array-type semiconductor device and its fabrication method and an electronic apparatus, particularly to an art effectively applied to an art for improving the reliability of external terminal connection of a ball-grid-array-type semiconductor device secured to a mounting board.

Because functions of electronic units have been improved, it is requested that a semiconductor device such as an IC (integrated circuit arrangement) or an LSI (large-scale integrated circuit arrangement) is provided with more external terminals (change to multiple pin). A QFP (Quad Flat Package) in which a lead is protruded from four sides of a rectangular sealing body (package) has corresponded to the change to multiple pin by decreasing the intervals between its external terminals to, for example, 0.4 mm and then 0.3 mm in order.

Moreover, as a package structure capable of decreasing the pitch between external terminals, a pin-grid-array-type semiconductor device and a ball-grid-array-type semiconductor device (hereafter also referred to as BGA-type semiconductor device) are developed.

In the case of a BGA-type semiconductor device, an external terminal serves as a ball electrode. The ball electrode is constituted with a metallic ball which does not deform or a solder ball which fuses and deforms.

The ball electrode is soldered to a land of a mounting board. Moreover, the mounting height of a semiconductor device is determined by the diameter of the solder ball (low-fusion-point solder ball which fuses at the time of reflow or high-fusion-point solder ball which does not fuse at the time of reflow) or that of the metallic ball.

A BGA-type semiconductor device is described in "Electron Materials", the April 1997 issue issued on Apr. 1, 1997, pp. 103–105, edited by KOGYOCHOSAKAI (transliterated).

Moreover, the structure of an external terminal comprising a solder ball or the like and the external-terminal structure when mounted are disclosed in published patent journal No. "5-508736" and the official gazettes of Japanese Patent No. 2500109 and Japanese Patent Application Laid-Open No. 8-31974.

A BGA-type semiconductor device has a structure in which bumpy external terminals (external electrodes) are arranged on the back of a wiring board (package substrate) like an array.

As one of BGA semiconductor devices, a structure is known in which solder balls or metallic balls are arranged like an array as external terminals on the back of a package substrate made of low-temperature co-fired ceramic (LTCC)

The present applicant also develops a BGA-type semiconductor device using an LTCC plate. FIG. 12 is a locally-cut out sectional view of a BGA-type semiconductor device developed by the present applicant. Moreover, FIG. 13 is an enlarged sectional view showing a ball-electrode support portion of the mounting structure of a BGA-type semiconductor device developed by the present applicant.

As shown in FIG. 12, a BGA-type semiconductor device 1 has a rectangular flat package substrate 2 comprising a multilayer wiring structure in which the top (principal plane) center is recessed in two stages. The package substrate 2 is constituted with a low-temperature co-fired ceramic multilayer substrate.

A semiconductor chip 5 is secured to the bottom of a deep recess 3 of the package substrate 2 through a joining material 4. Moreover, wiring 7 is provided for the bottom of a shallow recess 6. Furthermore, the front end portion extending toward the deep recess 3 of the wiring 7 is connected with a not-illustrated electrode of the semiconductor chip 5 by a conductive wire 9.

Furthermore, an insulating sealing resin 10 is injected into the recesses 3 and 6 and cured so as to cover the semiconductor chip 5 and the wire 9.

Furthermore, external terminals (external electrodes) 11 respectively constituted with a ball electrode are arranged like an array on the back (bottom) of the package substrate 2. The external terminal 11 comprises an electrode 15 constituted with wiring formed at the bottom of the package substrate 2 and a metallic ball 17 secured onto the electrode 15 through a pedestal layer 16 made of low-fusion-point solder. The metallic ball 17 is made of, for example, oxygen-free copper.

Furthermore, a plated film 21 is formed on the surface of the electrode 15 in order to improve the adhesiveness of solder (see FIG. 13). In the case of the plated film 21, the lower layer is made of a nickel layer 22 and the upper layer is formed with a gold layer 23.

Furthermore, the wiring 7 and joining material 4 to which the wire 9 of the package substrate 2 is connected are electrically connected to the bottom electrode 15 through a via 19 extending in the longitudinal direction and an internal wiring 20 extending in the horizontal direction in the package substrate 2.

Furthermore, because the pedestal layer 16 is fused once when the metallic ball 17 is set, layer 16 is widely wet along a part of the spherical surface of the metallic ball 17 and the circumferential surface of the layer 16 forms a curved surface between the metallic ball 17 and the electrode 15.

This type of the BGA-type semiconductor device 1 is built in a mounting board of an electronic apparatus.

A printed wiring board (PWB: FR-4) is generally used as a mounting board to be built in an electronic apparatus.

A BGA-type semiconductor device is mounted on paste solder printed by a metal mask by positioning the BGA-type semiconductor device so that external terminals of the BGA-type semiconductor device overlap, for example, lands on the surface of a mounting board, and then reflowing low-fusion-point solder previously provided for the surface of the land (ultimate temperature of 240° C., 180° C. for 40 sec), and securing the external terminals to the lands respectively. The solder on the land surface uses eutectic solder. In this case, because the top and the bottom of the metallic ball 17 are made of low-fusion-point solder (pedestal layer 16 and solder layer 33) as shown in FIG. 13, the ball 17 automatically moves to a stable position due to the surface tension of the solder and securely electrically connects a land 31 of a mounting board 30 with the electrode 15.

Moreover, the surface of the package substrate 2 is provided with a glass layer 12. The electrode is formed with a conductor layer 13 exposed from the glass layer 12. Furthermore, the surface of the mounting board 30 is also provided with an insulating film 32. The land 31 is formed at a portion exposed from the insulating film 32.

According to the method for mounting a BGA-type semiconductor device, the above reflow is performed at a temperature lower than the fusion temperature of high-fusion-point solder and higher than the fusion temperature of low-fusion-point solder. Therefore, the metallic ball 17 made of high-fusion-point solder does not fuse and the BGA-type semiconductor device 1 is kept at a predetermined height by the metallic ball 17. Thus, it is possible to prevent an electrode short circuit from occurring due to a solder bridge between lands.

Moreover, the present inventor finds in a reliability test (temperature cycle test) of a mounted BGA-type semiconductor device that the joint between the land 31 and the electrode 15 may deform so as to inversely tilt at the both ends of the package substrate 2 or the portion of the package substrate 2 for supporting the external terminal 11 may be cracked. Moreover, it is found that extreme one of these phenomena causes electrode disconnection.

FIG. 14 is a schematic view of a package substrate showing a state of the joint between a BGA-type semiconductor device developed by the present applicant and a mounting board after mounting the semiconductor device on the mounting board and performing a heat cycle test, which is obtained by tracing a microphotograph.

The package substrate of the BGA-type semiconductor device used for the above heat cycle test is a low temperature co-fired ceramic multilayer substrate which is a square substrate having a thickness of 0.9 mm and a side length of 15 mm. An external terminal has an array structure obtained by arranging metallic balls (diameter of 0.5 mm) at a pitch of 1.27 mm in 11 rows and 11 columns. The thickness of the package substrate including external electrodes is 1.6 mm. The printed wiring board is constituted with a four-layer structure plate (FR-4) having a thickness of 1.6 mm.

Moreover, the temperature cycle test is performed by repeatedly changing the temperatures of −40° C. and 125° C. every 30 min and the state in FIG. 14 is a state after 200 cycles.

A joint 35 between the land 31 of the mounting board 30 and the electrode 15 of the package substrate 2 of the BGA-type semiconductor device 1 further tilts at the both ends of the package substrate 2. The joint 35, though not illustrated in FIG. 14, comprises the metallic ball 17, and the pedestal layer 16 and solder layer 33 which serve as the top and bottom low-fusion-point solder layers.

The torsion and tilt of the joint 35 occur due to the difference of thermal expansion coefficient between the package substrate 2 constituted with a low-temperature co-fired ceramic multilayer substrate and the mounting board 30 constituted with a printed wiring board. That is, the thermal expansion coefficient α of the low-temperature co-fired ceramic multilayer substrate is approx. 5.5 ppm/° C. but the thermal expansion coefficient α of the printed wiring board (PWB: FR-4) is approx. 13 ppm/° C. which is greatly different from the thermal expansion coefficient of the multilayer substrate.

In the heat cycle test, the solder (solder layer 33) on the land 31 of the mounting board 30 is dragged toward the center of the package substrate 2 due to shrinkage of the mounting board 30 having a shrinkage ratio larger than that of the package substrate 2 at a low temperature and moreover dragged toward the both ends of the package substrate 2 at a high temperature. Though the solder layer 33 on the land 31 supporting the metallic ball 17 is easily dragged toward the center of the package substrate 2, it does not easily return to the both ends of the package substrate 2 because the tensile strength of solder decreases and simultaneously, an elongation occurs at a high temperature.

Therefore, the phenomenon shown in FIG. 14 occurs. Eutectic solder shows an approx. tenfold strength difference at a high temperature and a low temperature. Particularly, though the eutectic solder shrinks in a negative temperature region but the deformation of the solder is not easily restored in a high-temperature region because the tensile strength of the solder decreases.

When a stress is repeatedly applied to the joint 35, a crack 34 occurs in the brittle package substrate 2 (low-temperature co-fired ceramic multilayer substrate). The crack 34, as shown by the two-dot chain line in FIG. 13, occurs along the direction of a curved surface like a circular arc so as to shave the electrode 15 connecting with the joint 35 to deteriorate the reliability of the electrode or disconnect the electrode.

SUMMARY OF THE INVENTION

It is an object of the present invention to provide a ball-grid-array-type semiconductor device and its fabrication method in which electrode disconnection does not easily occur when the semiconductor device is mounted.

It is another object of the present invention to provide an electronic apparatus in which any mounting trouble does not easily occur in a mounted ball-grid-array-type semiconductor device.

The above and other objects and novel features of the present invention will become more apparent from the description of this specification and the accompanying drawings.

(1) A ball-grid-array-type semiconductor device comprising a package substrate including a ceramic wiring board having a semiconductor chip mounting portion on the principal plane and electrodes arranged like an array on the back, a semiconductor chip secured to the principal plane of the package substrate, connection means for electrically connecting the electrodes of the semiconductor chip with the wiring on the wiring board, a sealing body made of an insulating resin for covering the semiconductor chip provided for the principal plane side of the wiring board and the connection means, a pedestal layer made of low-fusion-point solder formed on the electrodes, and a metallic ball secured onto the pedestal layer; wherein a buffering layer made of high-fusion-point solder which covers the entire surface of the electrodes and whose margin extends on the back of the package substrate up to a predetermined length is formed on the electrodes and the pedestal layer is formed on the buffering layer.

The outside dimension of the buffering layer is larger than that of the pedestal layer, the diameter of the metallic ball is smaller than the outside dimension of the pedestal layer, and moreover the diameter of the joint between the pedestal layer and the buffering layer is larger than the diameter of the joint between the pedestal layer and the metallic ball and the circumferential surface of the pedestal layer is formed like a circular-arc plane so that the middle portion is recessed.

The package substrate is constituted with a low-temperature co-fired ceramic multilayer substrate. The metallic ball is made of high-fusion-point solder having a fusion point higher than that of copper, silver, or the solder forming the pedestal layer and the buffering layer. When the metallic ball is made of copper or silver, a metallic film such as a solder film having a high solder wettability, a rust prevention effect, and a fusion point higher than that of the solder forming the pedestal layer is formed on the surface of the metallic ball. The buffering layer is a solder layer formed with of a non-eutectic ternary alloy of lead, tin, and antimony. The pedestal layer is a solder layer formed with a non-eutectic quadruple alloy or non-eutectic ternary alloy of lead and tin containing either or both of bismuth and silver. The metallic ball has a diameter of larger than 0.5 mm.

The above ball-grid-array-type semiconductor device is fabricated by the following method.

A method for fabricating a ball-grid-array-type semiconductor device comprising a package substrate including a ceramic wiring board having a semiconductor chip mounting portion on the principal plane and electrodes arranged like an array on the back, a semiconductor chip secured to the principal plane of the package substrate, connection means for electrically connecting the electrodes of the semiconductor chip with the wiring on the wiring board, a sealing body constituted with an insulating resin and provided for the principal plane side of the package substrate to cover the semiconductor chip and the connection means, a buffering layer made of high-fusion-point solder which is formed on the electrodes to cover the entire surface of the electrodes and whose margin extends up to a predetermined length on the back of the package substrate, a pedestal layer made of low-fusion-point solder provided on the buffering layer, and a metallic ball secured onto the pedestal layer; prepares the package substrate after forming the sealing body, thereafter forms a solder lump on each electrode on the back of the package substrate, and then presses the solder lump by a flat pressing plate at a predetermined temperature to form the buffering layer with a certain thickness.

The method comprises the steps of locally printing a conductor for forming the electrodes on a glass ceramic layer which is the topmost layer of a not-sintered glass ceramic multilayer substrate, locally printing a glass layer in a region excluding the electrode forming region, flattening the surface of the glass ceramic multilayer substrate by relatively pressing a jig against the plane on which the glass layer is formed, forming a low-temperature co-fired ceramic multilayer substrate by sintering the glass ceramic multilayer substrate, forming a desired plated film on the surface of an electrode exposed from the glass layer, printing a high-fusion-point solder layer on the electrode more widely than the electrode plane, forming a spherical solder lump on the electrode by reflowing the high-fusion-point solder layer, and covering the whole of the electrode by relatively pressing a jig against the plane on which the solder lump is formed at a predetermined temperature and thereby deforming the solder lump and forming a buffering layer having a predetermined thickness. The solder lump is pressed by a jig having a thermal expansion coefficient close to the thermal expansion coefficient of the low-temperature co-fired ceramic multilayer substrate.

(2) A ball-grid-array-type semiconductor device comprising a package substrate including a ceramic wiring board having a semiconductor chip mounting portion on the principal plane and electrodes arranged like an array on the back, a semiconductor chip secured to the principal plane of the package substrate, connection means for electrically connecting the electrodes of the semiconductor chip with the wiring on the package substrate, a sealing body constituted with an insulating resin and provided for the principal plane side of the package substrate to cover the semiconductor chip and the connection means, a pedestal layer made of low-fusion-point solder and formed on the electrodes, and a metallic ball secured onto the pedestal layer; and a mounting board are used. The ball-grid-array-type semiconductor device is an electronic apparatus secured to the land of the mounting board by solder through the metallic ball. A buffering layer made of high-fusion-point solder which covers the entire surface of the electrodes and whose margin extends up to a predetermined length on the back of the package substrate is formed on the electrodes and the pedestal layer is formed on the buffering layer.

The outside dimension of the buffering layer is larger than that of the pedestal layer, the diameter of the metallic ball is smaller than the outside dimension of the pedestal layer, and the diameter of the joint between the pedestal layer and the buffering layer is larger than that of the joint between the pedestal layer and the metallic ball and the circumferential surface of the pedestal layer is formed like a circular-arc plane so that the middle portion is recessed.

The package substrate is constituted with a low-temperature co-fired ceramic multilayer substrate. The metallic ball is made of high-fusion-point solder having a fusion point higher than that of copper, silver, or the solder forming the pedestal layer and the buffering layer. When the metallic ball is made of copper or silver, a metallic film such as a solder film having a high solder wettability, a rust prevention effect, and a fusion point higher than that of the solder forming the pedestal layer is formed on the surface of the metallic ball. The buffering layer is a solder layer formed with a non-eutectic ternary alloy of lead, tin, and antimony. The pedestal layer is formed with a solder layer formed with a non-eutectic quadruple alloy or non-eutectic ternary alloy of lead and tin containing either or both of bismuth and silver. The metallic ball has a diameter of larger than approx. 0.5 mm.

According to the means (1): (a) An electrode provided for one side of a low-temperature co-fired ceramic multilayer substrate is entirely covered with a buffering layer. Therefore, even if a thermal stress is applied to a joint secured to the electrode, the buffering layer absorbs the stress and thereby, any large stress does not work on the boundary between the electrode and the glass layer around the electrode and a portion nearby the boundary or a crack large enough to shave the electrode does not occur in the low-temperature co-fired ceramic multilayer substrate. As a result, the electrode disconnection or mounting reliability is not deteriorated and the service life is improved. Moreover, the reliability of an electronic apparatus is improved.

(b) Because the pedestal layer between the buffering layer and the metallic ball is formed like a circular-arc plane so that the circumferential surface of the layer is recessed and the central portion is constricted, it is possible to decrease the maximum equivalent stress and prevent the joint from breaking.

(c) The metallic ball is made of high-fusion-point solder having a fusion point higher than that of copper, silver, or the solder forming the pedestal layer or buffering layer and connected to a land or electrode through low-fusion-point solder. Therefore, the size of the metallic ball can be maintained and a semiconductor device can be mounted on a mounting board at a predetermined height. Moreover, a solder bridge phenomenon due to crush of a joint or a short circuit between electrodes will not occur.

(d) When the metallic ball is made of copper or silver, it is possible to securely mount solder at the time of mounting and improve the reliability of an electronic apparatus because a metallic film such as a solder film having a high solder wettability, a rust prevention effect, and a fusion point higher than that of the solder forming the pedestal layer is formed on the surface of the metallic ball.

(e) The buffering layer is a non-eutectic-ternary-alloy solder layer containing antimony. Because the antimony improves a liquid-phase temperature, it is possible to secure a metallic ball to a buffering layer by low-fusion-point solder (pedestal layer) without fusing the buffering layer when fabricating a ball-grid-array-type semiconductor device and moreover, securely mount the ball-grid-array-type semiconductor device by low-fusion-point solder without fusing the buffering layer. Moreover, mutual diffusion does not occur because the buffering layer is not fused.

(f) Antimony is added to the buffering layer. The antimony makes it possible to prevent a brittle fracture in a low-temperature region at a temperature cycle test and a buffering layer from breaking. Therefore, it is possible to improve the reliability of an electronic apparatus including a ball-grid-array-type semiconductor device.

(g) The pedestal layer is a solder layer formed with a non-eutectic quadruple alloy or non-eutectic ternary alloy of lead and tin containing either or both of bismuth and silver. Because bismuth and silver have a function for improving the wettability of solder, it is possible to form a pedestal layer between a buffering layer and a metallic ball into a so-called waist shape, that is, a curved surface (circular-arc plane) in which the central portion is constricted and the circumferential surface is recessed. Therefore, it is possible to improve the disruptive strength of a joint between a land and an electrode because the maximum equivalent stress is decreased.

(h) By adding bismuth and silver, it is possible to prevent the localization of lead phase at a temperature cycle test and strength deterioration due to the location and improve the reliability of a ball-grid-array-type semiconductor device when the semiconductor device is mounted.

(i) Because the metallic ball has a diameter of larger than approx. 0.5 mm, a joint between a land and an electrode does not move at a temperature cycle test or electrode disconnection does not occur. Therefore, the reliability of an electronic apparatus is improved and the service life of a built-in ball-grid-array-type semiconductor device is lengthened.

(j) When fabricating a buffering layer in fabrication of a ball-grid-array-type semiconductor device, a solder lump is formed on each electrode on the back of a package substrate and then, the solder lump is pressed by a flat pressing plate and heated to form the buffering layer having a certain thickness. In this case, the thermal expansion coefficient (linear expansion coefficient) of the low-temperature co-fired ceramic multilayer substrate and the linear expansion coefficient of the pressing plate are close to each other. Because the linear expansion coefficients are close to each other, any cross-directional stress produced due to the difference between the coefficients is not applied to the joint between the package substrate and the buffering layer at the time of heating or cooling. Therefore, the joint is not deteriorated due to reheating or refusing. As a result, no displacement occurs between the low-temperature co-fired ceramic multilayer substrate and the pressing plate. Thus, it is possible to accurately form a buffering layer covering each electrode on each electrode. This makes it possible to prevent a short circuit between electrodes and moreover, decrease the pitch between electrodes.

(k) A buffering layer is formed on each electrode at one side of a package substrate formed on a low-temperature co-fired ceramic multilayer substrate by forming a glass layer, thereafter flattening the glass-layer forming plane of a not-sintered glass ceramic multilayer substrate and then sintering the plane, forming a plated film on the surface of each electrode, then printing a high-fusion-point solder layer widely than the electrode plane on the electrodes and moreover forming a spherical solder lump on the electrodes by reflowing the high-fusion-point solder layer, and crushing the solder lump by a jig at a predetermined temperature. Therefore, the crushed solder lump can smoothly spread on the flat low-temperature co-fired ceramic multilayer substrate because there is not any obstacle and moreover, the buffering layer securely covers all the electrodes and is formed at a predetermined thickness. Therefore, because a pedestal layer can be accurately formed on the buffering layer, it is possible to form the secured state of a metallic ball formed on the pedestal layer at a high repeatability and form regularly-arranged array-like external terminals.

BRIEF DESCRIPTION OF THE DRAWINGS

FIG. 2 is a locally-cut-out sectional view showing the BGA-type semiconductor device of the embodiment 1 in FIG. 1;

FIG. 3 is a schematic sectional view showing the mounted structure of the BGA-type semiconductor device of the embodiment 1 in FIG. 1;

DESCRIPTION OF THE PREFERRED EMBODIMENTS

The preferred embodiments of the present invention are described below in detail by referring to the accompanying drawing. In every drawing for explaining the embodiments of the present invention, components having the same function are provided with the same symbol and their repetitive description is omitted.

[Embodiment 1]

Figure 1:
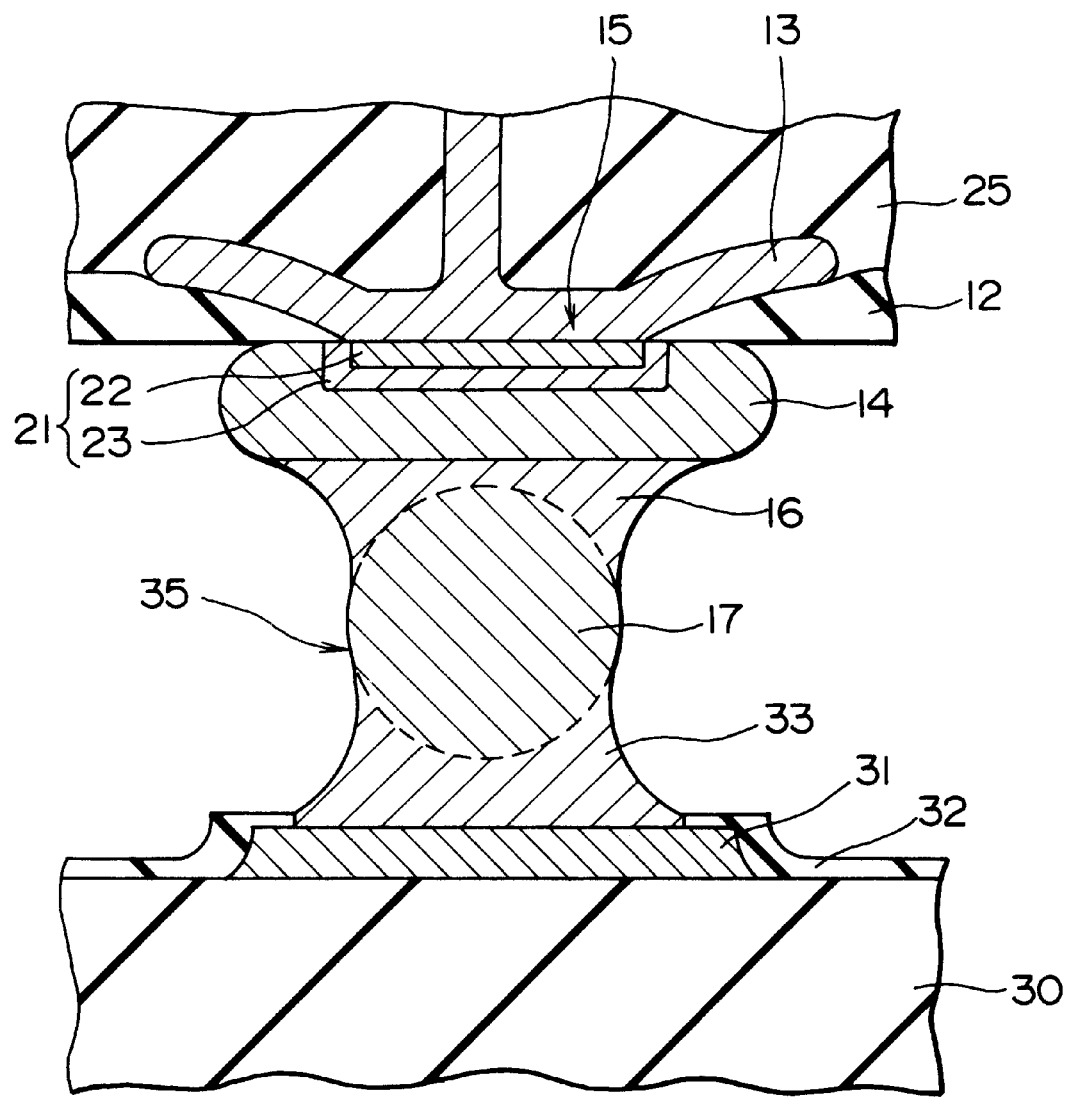
FIG. 1 is a schematic sectional view showing a part of an electronic apparatus in which the BGA-type semiconductor device of embodiment 1 of the present invention is built.

FIGS. 1 to 11 are illustrations related to the BGA-type semiconductor device of embodiment 1 of the present invention. FIG. 1 is a schematic sectional view showing a part of an electronic apparatus including the BGA-type semiconductor device and FIG. 2 is a locally-cut-out sectional view showing the BGA-type semiconductor device.

The BGA-type semiconductor device 1 of the embodiment 1, as shown in FIG. 2, has a rectangular flat package substrate 2 having a multilayer wiring structure in which the top (principal plane) center is recessed in two states. The package substrate 2 is formed with a low-temperature co-fired ceramic multilayer substrate.

The low-temperature co-fired multilayer substrate is made of, for example, 55% of alumina and 45% of lead-borosilicate-based glass, which is a square plate having a four-layer wiring structure, thickness is 0.9 mm and a side length of 15 mm.

Moreover, the multilayer substrate has the following main physical properties: sintering temperature of 900° C., burning shrinkage rate of 13.2%, density of 3.15 g/cm$^3$, percentage of water absorption of 0.05% or less, deposition resistance of 3000 Kgf/cm$^2$, thermal expansion coefficient of 5.2 ppm/° C., heat conductivity of 7.8, permittivity of 0.3% or less, and dielectric breakdown voltage of 15 KV/mm.

A conductor such as wiring is formed by printing and burning Ag.Pd pastes. The wiring length is approx. 10 $\mu$m. A part of the wiring serves as an electrode for forming a ball electrode or a wire bonding pad for connecting wires. Moreover, a nickel plating or gold plating is formed on these portions to improve the connection with a ball electrode or wire.

The semiconductor chip 5 is secured to the bottom of a deep recess 3 of the package substrate 2 through a joining material 4. Moreover, the wiring 7 is provided for the bottom of a shallow recess 6. Furthermore, the front end of the wiring 7 extending toward the deep recess 3 is connected with a not-illustrated electrode of the semiconductor chip 5 by a wire 9.

Furthermore, an insulating sealing resin 10 is injected into the recesses 3 and 6 and cured so as to cover the wire 9.

External terminals (external electrodes) 11 respectively comprising a ball electrode are arranged on the back (bottom) of the package substrate 2 like an array. The external terminals 11 have an array structure in which the terminals 11 are arranged in 11 rows and 11 columns at a pitch of 1.27 mm. The thickness of the array structure including external electrodes is approx. 1.6 mm.

The external terminal 11 comprises an electrode 15 constituted with the wiring formed at the bottom of the package substrate 2, a buffering layer 14 constituted with a high-fusion-point solder layer having a predetermined thickness to entirely cover the electrode 15, and a metallic ball 17 secured onto the buffering layer 14 through a pedestal layer 16 made of solder.

When the metallic ball 17 has a diameter of 0.5 mm, a joint is extremely deformed. Therefore, a metallic ball having a diameter of more than 0.5 mm is selected as the metallic ball 17. A metallic ball having a diameter of 0.6 to 0.8 mm is used as the metallic ball 17.

The metallic ball 17 is made of high-fusion-point solder having a fusion point higher than that of copper and silver or that of the solder forming the pedestal layer 16 and buffering layer 14. When forming the metallic ball 17 with copper or silver, a metallic film such as a solder film (80 to 95 Pb/Sn) having a high solder wettability, a rust prevention effect, and a fusion point higher than that of the solder forming the pedestal layer is formed on the surface of the metallic ball. In the case of the embodiment 1, the metallic ball 17 is constituted with a metallic ball with a final diameter of 0.6 mm obtained by plating the surface of an oxygen-free copper ball having a diameter of 0.58 mm with solder of Pb/Sn 10 up to a thickness of 10 $\mu$m.

This embodiment uses oxygen-free copper because the oxygen-free copper has a heat conductivity of 393 W·m$^{-1}$·K$^{-1}$ which is larger than that of high-fusion-point solder of 37 W·m$^{-1}$·K$^{-1}$ (100° C.) and thereby, it can be expected to reduce the heat resistance of the entire package. The heat resistance of the package after mounted comes to 29° C./W which achieves the target.

The buffering layer 14 is formed with a high-fusion-point solder layer of non-eutectic ternary alloy made of lead (Pb), tin (Sn), and antimony (Sb). The buffering layer 14 has a thickness of, for example, 100 mm and a diameter of 0.9 to 1.1 mm. The alloy composition of the buffering layer 14 has, for example, 10 Sn, 8 Sb, and 1 Pb (liquid-phase temperature of 261° C. and solid-phase temperature of 247° C.)

By using solder containing antimony, the following advantages are obtained.

(1) High-fusion-point solder with a liquid-phase temperature of 261° C. and a solid-phase temperature of 247° C. is obtained. Thereby, mutual diffusion does not occur and shape deformation decreases when forming the pedestal layer 16 made of low-fusion-point solder on the buffering layer 14 and softening the pedestal layer 16 to fix the metallic ball 17. This shows the same advantage for mounting.

(2) Antimony is effective for prevention of lead from segregation and prevention of lead from brittle fracture in a low temperature region.

(3) Because the solder containing antimony has a small elongation (18.6% at room temperature) and a large tensile strength (56 N/mm$^2$), it serves as a buffering layer against a stress strain.

The pedestal layer 16 is formed with a low-fusion-point solder layer made of non-eutectic quadruple alloy or non-eutectic ternary alloy of lead and tin containing ether or both of bismuth (Bi) and silver (Ag). Low-fusion-point solder made of 57 Sn, 3 Bi, and 40 Pb has a liquid-phase temperature of 184° C. and a solid-phase temperature of 171° C. Moreover, low-fusion-point solder made of 62 Sn, 2 Ag, and 36 Pb has a liquid-phase temperature of 190° C. and a solid-phase temperature of 179° C.

Moreover, the thinnest portion of the pedestal layer 16 for supporting the metallic ball 17 has a thickness of, for example, 0.05 mm. It is permitted that the thinnest portion has a thickness of 0.01 to 0.09 mm.

Figure 10:
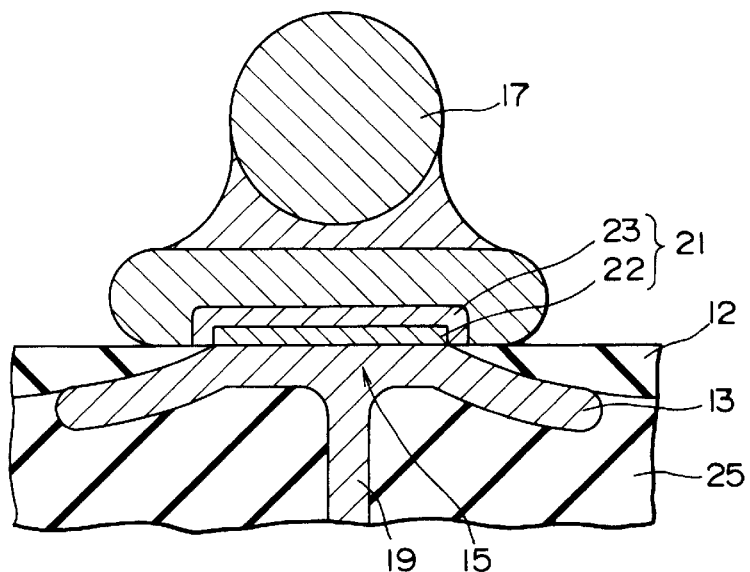
FIG. 10 is a locally enlarged sectional view showing the state in which a pedestal layer is fused and a metallic ball is secured on a buffering layer while the BGA-type semiconductor device of the embodiment 1 in FIG. 1 is fabricated.

As shown in FIG. 10, a portion exposed from a glass layer 12 is used as the electrode 15 by printing a conductor layer 13 for forming the electrode 15 on a green sheet (unburned glass ceramic plate 25), printing glass so as to be mounted on the margin of the conductor layer 13, and then pressing the surface of the glass by a flat jig. In the case of this embodiment 1, the electrode 15 has a diameter of approx. 0.6 mm.

A plated film 21 is formed on the surface of the electrode 15. The plated film 21 is formed with a lower nickel layer 22 and an upper gold layer 23. For example, the nickel layer 22 has a thickness of approx. 2 to 5 µm and the gold layer has a thickness of approx. 0.1 to 0.5 µm.

The buffering layer 14 completely covers the electrode 15. Therefore, the margin of the buffering layer 14 extends on the glass layer 12 (package substrate 2) by a predetermined length.

Moreover, the wiring 7 and joining material 4 to which the wire 9 of the package substrate 2 is connected is electrically connected to the bottom electrode 15 through a via 19 extending in the longitudinal direction and internal wiring 20 extending in the horizontal direction in the package substrate 2.

Because the pedestal layer 16 is once fused when setting the solder ball 17, it dampens a part of the spherical surface of the solder ball 17 and its margin forms a curved surface (circular-arc plane) whose middle portion is recessed between the solder ball 17 and the electrode 15.

In other words, the external terminal (external electrode) 11 and the pedestal layer 16 are gradually decreased in sectional area from the metallic ball 17 toward the buffering layer 14 but increased from the middle and their margins form a curved surface shown by a negative exponential-function curve.

Then, a method for fabricating the BGA-type semiconductor device 1 of this embodiment 1 is described below.

First, the package substrate 2 is formed. To form the package substrate 2, a plurality of unburned glass ceramic plates (green sheets) are prepared and superimposed each other.

Each green sheet is constituted with a rectangular plate of the same size, and guide holes and via-holes are formed on the sheet. Moreover, a conductor is injected into each via-hole and wiring made of a conductor is formed on the surface or surface and back of the sheet. The conductor is made of Ag.Pd paste. Furthermore, the via-hole has a diameter of 0.2 mm and the conductor has a thickness of approx. 10 µm.

Figure 5:
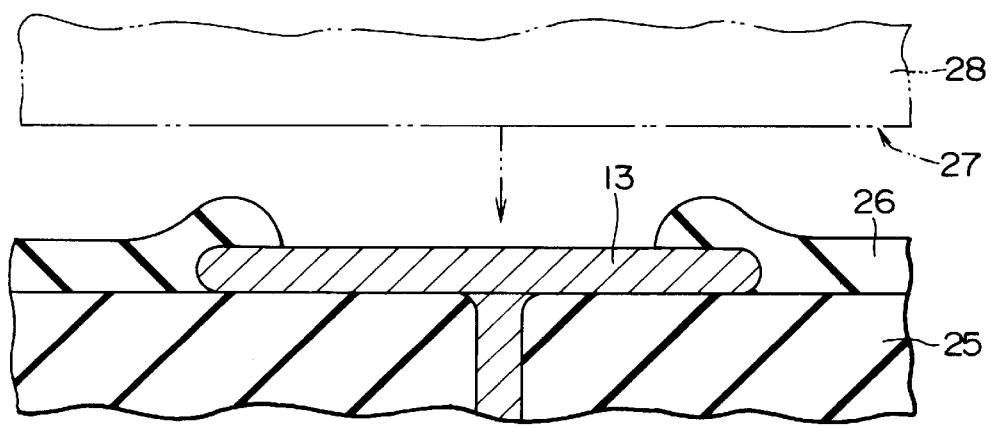
FIG. 5 is a local enlarged sectional view showing the state in which an electrode of a package substrate is fabricated while the BGA-type semiconductor device of the embodiment 1 in FIG. 1 is fabricated.

In the case of the above green sheet, a conductor layer 13 for forming the electrode 15 is printed on the uppermost-layer unburned glass ceramic plate 25 (green sheet) on which the package substrate 2 is formed as shown in FIG. 5. Thereafter, a glass paste layer 26 is printed on the green sheet. The glass paste layer 26 is also printed on the conductor layer 13 so as to overlap with the margin of the layer 13.

Then, the surface of the glass ceramic plate 25 is flattened by pressing a jig 28 whose bottom is a flat plane 27 against the surface. As a result, the margin of the conductor layer 13 is embedded under the glass paste layer 26 though not illustrated. Moreover, a conductor layer portion exposed on the surface serves as the electrode 15. The surface of the electrode 15 is flush with the surface of the glass paste layer 26.

Figure 6:
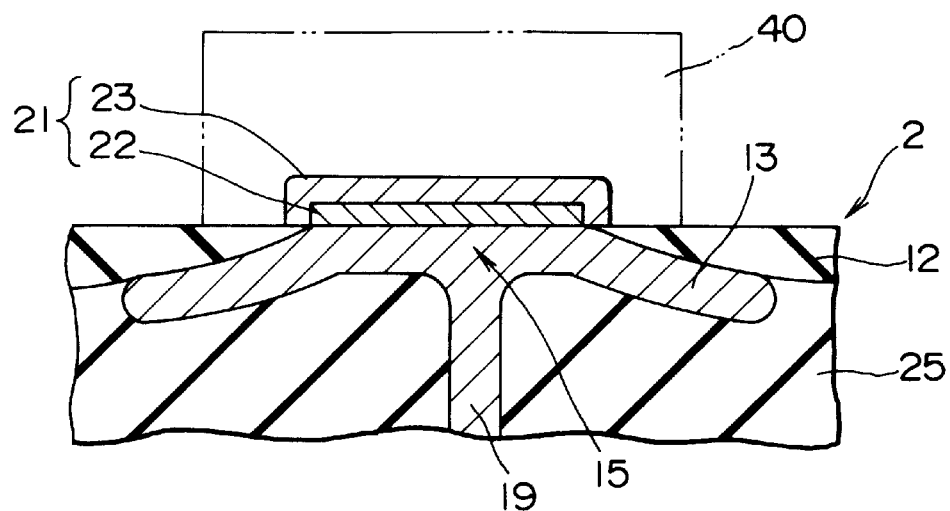
FIG. 6 is a locally enlarged sectional view showing the state in which a plated film is formed on the surface of an electrode of a package substrate while the BGA-type semiconductor device of the embodiment 1 in FIG. 1 is fabricated.

Then, a multilayer-state green sheet is burned. As a result, as shown in FIG. 6, the margin of the conductor layer 13 is embedded under the glass layer 12. Moreover, the surface of the electrode 15 is flush with the surface of the glass layer 12.

Then, a plated film 21 is formed on the surface of the electrode 15 through plating. In the case of the plating, a nickel layer 22 is formed by electroless plating and then, a gold layer 23 is formed. For example, the nickel layer 22 has a thickness of approx. 2 to 5 µm and the gold layer 23 has a thickness of approx. 0.1 to 0.5 µm.

The electrode 15 provided with a plated film has a diameter of, for example, 0.6 mm. While the plating is performed, a plated film is also formed on a wire-bonding pad portion.

Then, the burned multilayer-structure glass ceramic plate is cut to form the package substrate 2.

Figure 4:
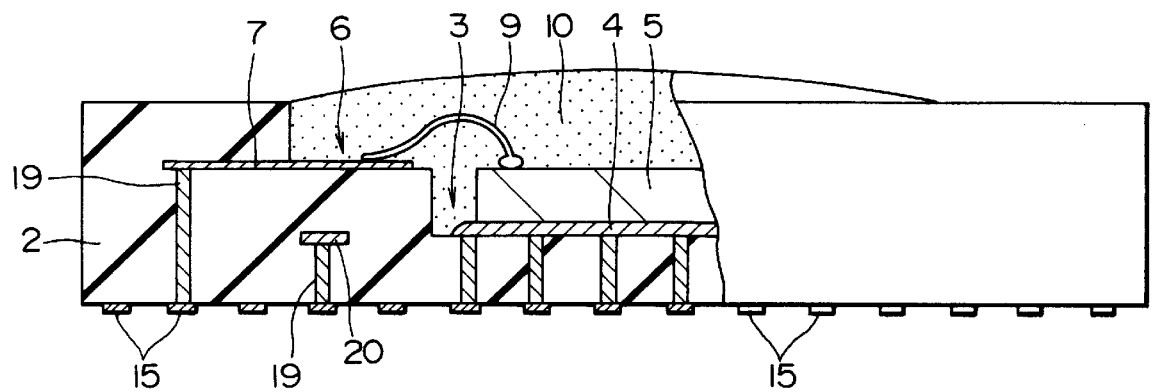
FIG. 4 is a sectional view showing the BGA-type semiconductor device of the embodiment 1 in FIG. 1 before a ball electrode is formed on an electrode of a package substrate while the semiconductor device is fabricated.

Then, as shown in FIG. 4, a semiconductor chip 5 is secured to the bottom of the deep recess 3 of the package substrate 2 through a joining material 4 and the front end of wiring 7 on the shallow recess 6 is connected with the electrode of the semiconductor chip 5 by a wire 9. Moreover, the deep recess 3 and shallow recess 6 are filled with a sealing resin 10 made of an insulating resin. It is also possible to use any other means as the connection means between the wiring 7 and the semiconductor chip 5.

Then, a buffering layer is formed on the electrode 15 on the back of the package substrate 2 so as to cover the electrode 15.

Figure 7:
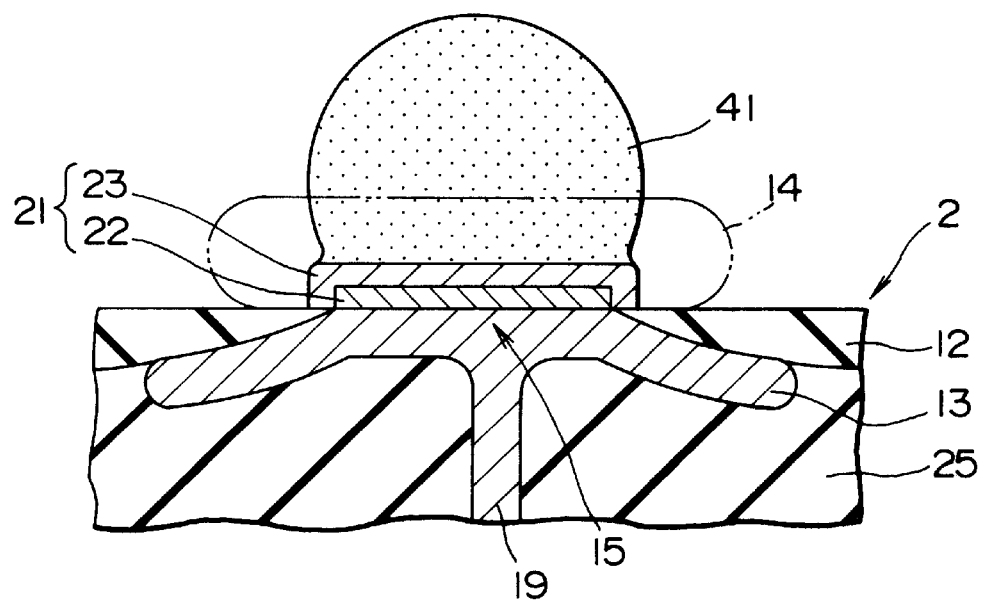
FIG. 7 is a locally enlarged sectional view showing the state in which a solder lump is formed in order to form a buffering layer on the surface of an electrode of a package substrate while the BGA-type semiconductor device of the embodiment 1 in FIG. 1 is fabricated.

The buffering layer is formed in accordance with the following procedure. FIG. 6 is an illustration showing a part of the package substrate 2. As shown in FIG. 6, paste-like high-fusion-point solder is printed on the package substrate 2 by a not-illustrated metal mask to form a high-fusion-point solder layer 40 on each electrode 15. Thereafter, the package substrate 2 is reflowed in a reflow oven having a nitrogen environment at an ultimate temperature of 280° C. to form a solder lump 41 as shown in FIG. 7. Then, the solder lump 41 is flattened by pressing the lump 41 with a jig 42 having a flat plane to form a buffering layer 14 having a diameter of 0.9 to 1.1 mm and a thickness of 100 µm. The flat plane of the buffering layer 14 has a diameter of 0.8 mm or more.

The diameter of the solder lump 41 can be adjusted by adjusting the size of the high-fusion-point solder layer 40 printed by selecting the thickness and aperture of the metal mask.

Because antimony is added to the solder for forming the buffering layer 14, the solder is high-fusion-point solder. The buffering layer 14 is formed with 10 Sn, 8 Sb, and 1 Pb (liquid-phase temperature of 261° C. and solid-phase temperature of 247° C.). By adding antimony to solder, high-fusion-point solder having a liquid-phase temperature of 261° C. and a solid-phase temperature of 247° C. is obtained.

Moreover, by adding antimony to solder, the elongation of the solder decreases (18.6% at room temperature) and the tensile strength of it increases (56 N/mm$^2$), and the solder serves as a cushioning material against a stress strain.

After forming the solder lump 41, flux contained in the paste-like high-fusion-point solder is cleaned and removed by alternate flon.

Figure 8:
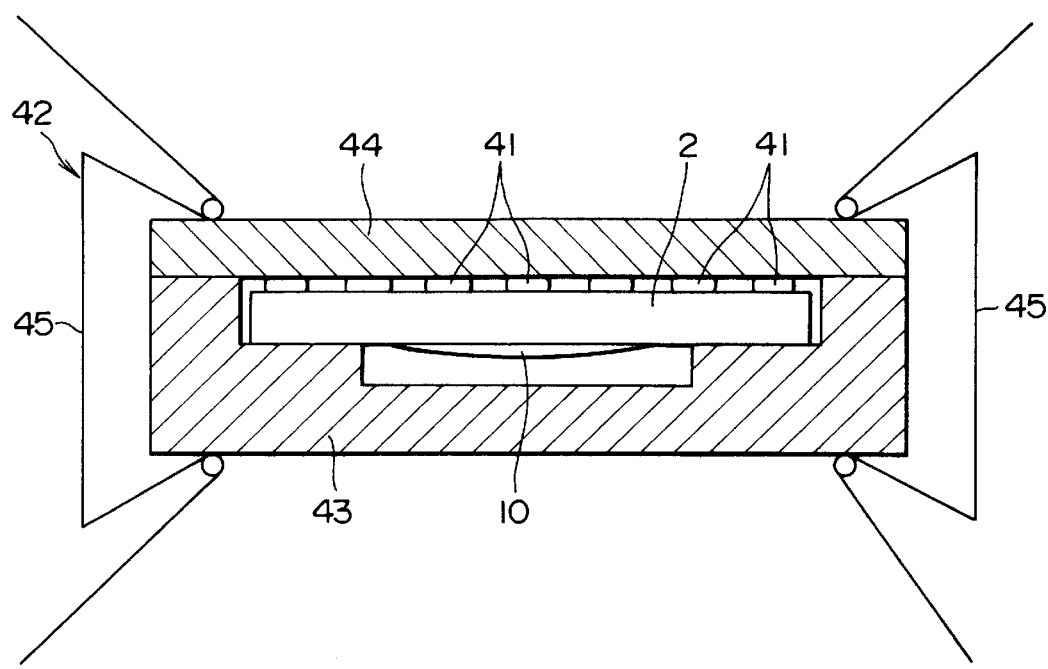
FIG. 8 is a schematic sectional view showing the state in which a buffering layer is formed on the surface of an electrode of a package substrate while the BGA-type semiconductor device of the embodiment 1 in FIG. 1 is fabricated.

As shown in FIG. 8, the jig 42 for pressing the solder lump 41 comprises a jig body 43 having a recess for supporting the package substrate 2, a flat jig lid (pressing plate) 44 superimposed on the jig body 43 to crush the solder lump 41, and a plurality of clips 45 for unifying the jig body 43 and the jig lid 44 into one body. Moreover, the jig body 43 and the jig lid 44 are made of a material having a thermal expansion coefficient almost equal to that of the package substrate 2. The jig lid 44 and the jig body 43 are made of 96% alumina.

The package substrate 2 provided with the solder lump 41 is put in the jig body 43. In this case, the solder lump 41 is put in the jig body 43 so as to be exposed to the outside. Then, the jig lid 44 is superimposed on the jig body 43 to hold the margins of the jig body 43 and the jig lid 44 with a clip 45.

Then, the jig 42 is put in a reflow oven having a predetermined temperature (ultimate temperature of 280° C.) and a nitrogen environment (liquid-phase time of 40 sec) to flatten the solder lump 41 by crushing the lump 41 with the flat plane of the jig lid (pressing plate) 44. As a result, the solder lump 41 is formed as a buffering layer 14 having a thickness of 100 μm. While the solder lump 41 is flattened, it is crushed by pressure and extends beyond the circumference of the electrode 15 because the surface of the electrode 15 is flush with the surface of the glass layer 12. When the glass layer 12 on the surface of the package substrate 2 is not flattened, it is difficult to form the flat buffering layer 14 covering the whole of the electrode 15.

Moreover, it is confirmed that the buffering layer 14 has no problem in mounting when the layer 14 has a thickness of 100 ±20 μm.

Figure 9:
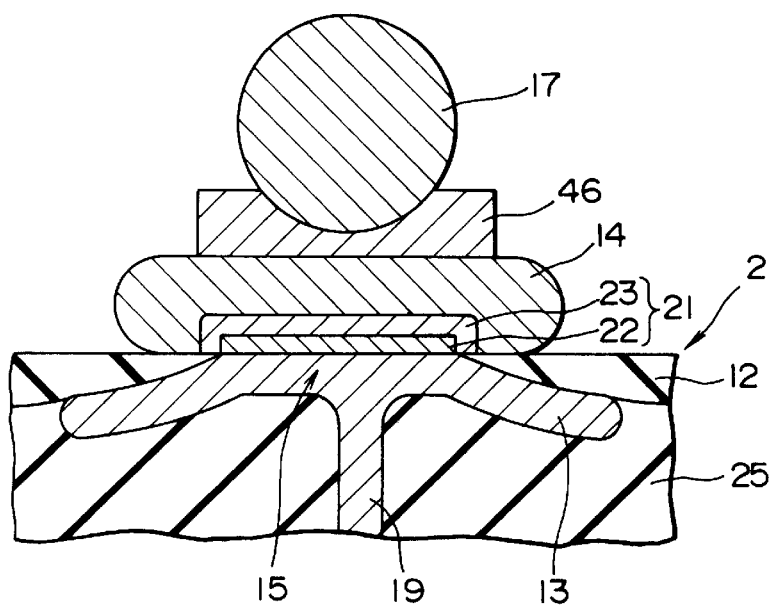
FIG. 9 is an enlarged sectional view showing the state in which a pedestal layer is formed on a buffering layer and moreover a metallic ball is set on the pedestal layer while the BGA-type semiconductor device of the embodiment 1 in FIG. 1 is fabricated.

Then, the package substrate 2 is taken out of the jig 42 to print low-fusion-point solder again and print a pedestal forming solder layer 46 on each buffering layer 14 as shown in FIG. 9. The pedestal forming solder layer 46 has, for example, a thickness of 0.2 mm and a diameter of 0.7 mm so as to mount a metallic ball 17 having a diameter of 0.6 on it.

The pedestal forming solder layer 46 is formed with a solder layer made of a non-eutectic quadruple or ternary alloy of lead and tin containing either or both of bismuth and silver. Low-fusion-point silver made of 57 Sn, 3 Bi, and 40 Pb has a liquid-phase temperature of 184° C. and a solid-phase temperature of 171° C. Moreover, low-fusion-point solder made of 62 Sn, 2 Ag, and 36 Pb has a liquid-phase temperature of 190° C. and a solid-phase temperature of 179° C.

Then, a metallic ball 17 having a diameter of 0.6 mm is mounted on the pedestal forming solder layer 46. The metallic ball 17 is made of, for example, oxygen-free copper and a not-illustrated metallic film such as a solder film having a high solder wettability, a rust prevention effect, and a fusion point higher than that of the solder for forming the pedestal layer 16 is formed on the surface of the metallic ball 17.

The metallic ball 17 can be made of silver instead of a copper-based metal. Moreover, the metallic ball 17 can use a high-fusion-point solder ball having a fusion point higher than that of the low-fusion-point solder for forming the pedestal layer 16 or the low-fusion-point solder attached to a land of a mounting board. To use a silver or copper ball, it is necessary to form a metallic film having a high solder wettability, a rust prevention effect, and a fusion point higher than that of the solder for forming the pedestal layer on the surface of the silver or copper ball.

Then, the package substrate 2 is put in a reflow oven having a nitrogen environment and the pedestal forming solder layer 46 is fused to secure the metallic ball 17 to the buffering layer 14 through the pedestal layer 16. The heating and fusing conditions of the pedestal forming solder layer 46 are, for example, an ultimate temperature of 220° C. and a liquid layer time of 40 sec.

After joining, cleaning is performed with flon.

When the pedestal forming solder layer 46 is reflowed, bismuth or silver contained in the layer 46 has an effect for improving the wettability of solder. Therefore, it is possible to form the pedestal layer 16 between the buffering layer 14 and the metallic ball 17 into a so-called waist shape, that is, a curved surface (circular-arc plane) in which the central portion is constricted and the circumferential surface is recessed.

Moreover, the thinnest portion of the pedestal layer 16 for supporting the metallic ball 17 has a thickness of, for example, 0.05 mm. It is permitted that this portion has a thickness of 0.01 to 0.09 mm.

Thereby, an external terminal (external electrode) 11 is formed and the BGA-type semiconductor device 1 shown in FIG. 2 is fabricated.

The BGA-type semiconductor device 1 is mounted on a mounting board 30 of an electronic apparatus as shown in FIG. 3.

The mounting board 30 is a printed wiring board (PWB: FR-4) having a four-layer structure with a plate thickness of 1.6 mm.

The BGA-type semiconductor device 1 is mounted by positioning the BGA-type semiconductor device 1 so that the external terminal 11 of the BGA-type semiconductor device 1 is superimposed on the land 31 on the surface of the mounting board 30, then reflowing the paste-like solder printed on the surface of the land 31 by a metal mask or the low-fusion-point solder previously provided for the surface of the external terminal 11 (ultimate temperature of 240° C., 180° C. or higher for 40 sec), and securing each external terminal 11 to each land 31.

In this case, as shown in FIG. 1, the metallic ball 17 of the external terminal 11 automatically moves to a stable position due to the surface tension of solder or the like because the ball 17 is held by low-fusion-point solder at its top and bottom (pedestal layer 16 and solder layer 33) and a joint 35 formed with the metallic ball 17 and the upper pedestal layer 16 and the lower solder layer 33 which are made of low-fusion-point solder securely and electrically connects the land 31 of the mounting board 30 with the buffering layer 14 on the electrode 15.

It is possible to form the pedestal layer 16 and the solder layer 33 into a so-called waist shape, that is, a curved surface (circular-arc plane) in which the central portion is constricted and the circumferential surface is recessed. As a result, it is possible to decrease the maximum equivalent stress and prevent the joint from breaking at the pedestal layer 16 and the solder layer 33.

Figure 11:
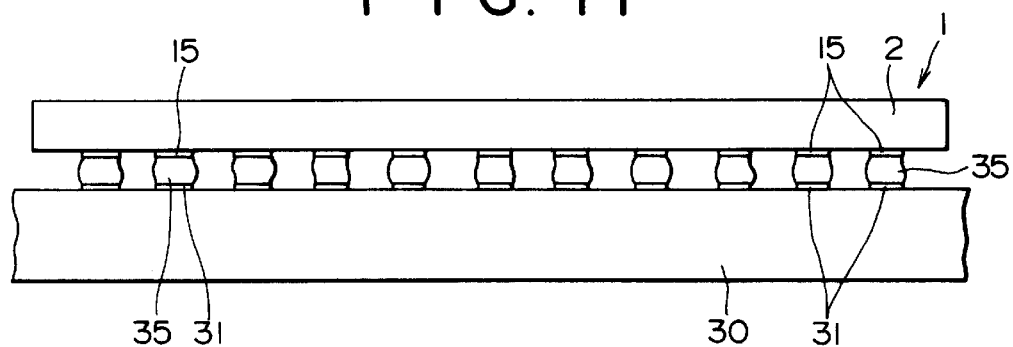
FIG. 11 is a local schematic view showing the state of a joint of the BGA-type semiconductor device of the embodiment 1 in FIG. 1 after mounting the semiconductor device on a mounting board and performing a heat cycle test.
Figure 12:
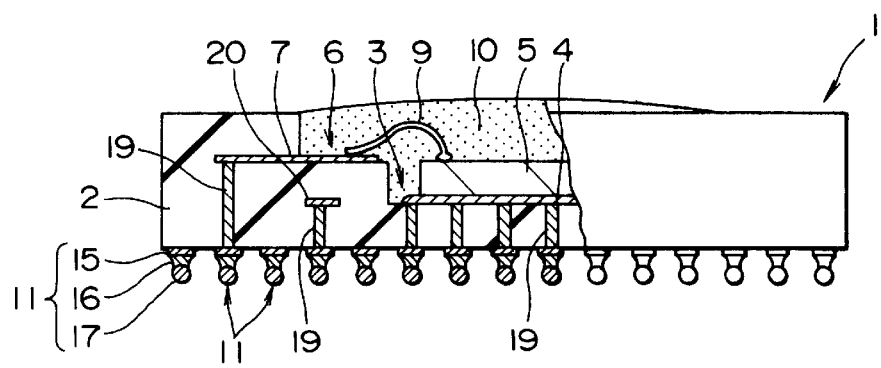
FIG. 12 is a locally-cut-out sectional view showing a BGA-type semiconductor device developed by the present applicant.
Figure 13:
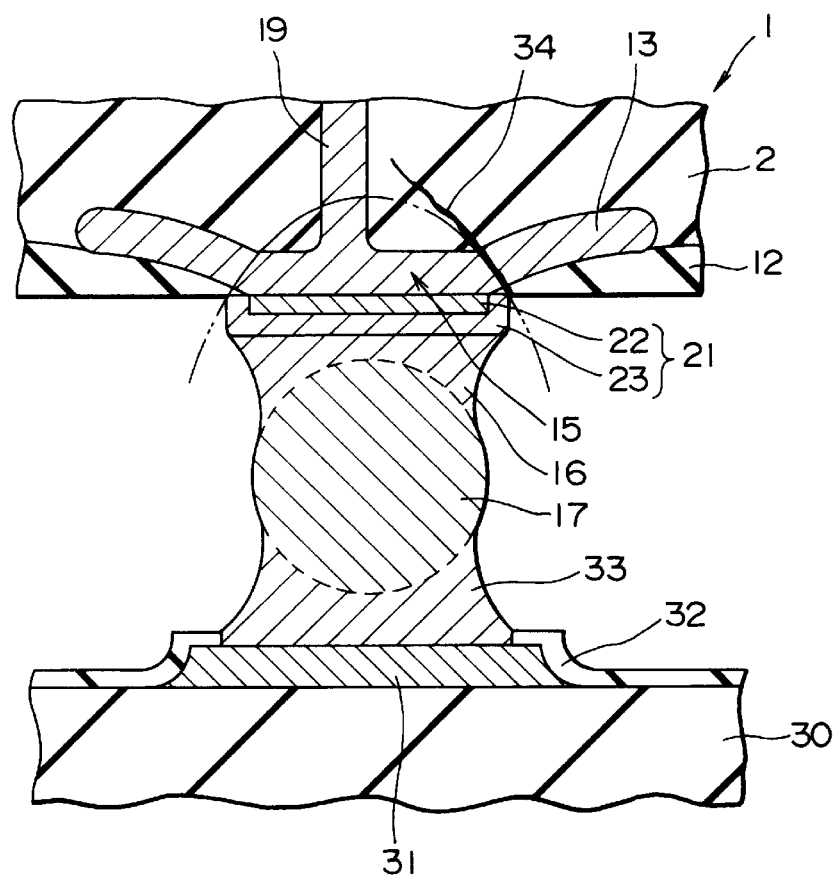
FIG. 13 is a sectional view showing a ball electrode support portion of the mounting structure of a BGA-type semiconductor device developed by the present applicant.
Figure 14:
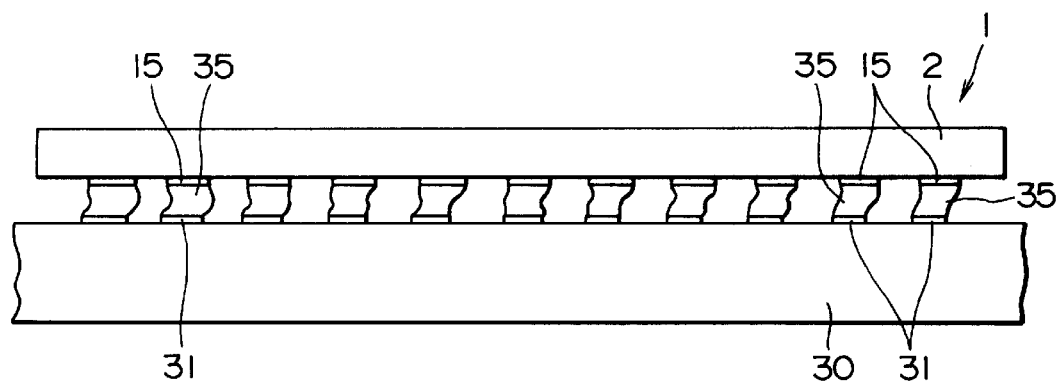
FIG. 14 is a local schematic view showing the state of a joint of a BGA-type semiconductor device developed by the present applicant after mounting the semiconductor device on a mounting board and performing a heat cycle test.

FIG. 11 is an illustration obtained by tracing a photo showing the state of the joint 35 after 200 cycles in a heat cycle test. As shown in FIG. 11, any displacement of the joint 35 does not occur or any tilt due to the displacement does not occur and thus, a structure free from solder bridges can be obtained.

The heat cycle test is performed by repeatedly changing −40° C. and 125° C. every 30 min.

When the buffering layer 14 is not used, the stress under deformation is concentrated on a glass ceramic substrate and cracks occur in the substrate. From FIG. 11, however, it is found that the portion of the eutectic solder layer of this structure having the buffering layer 14 is the weakest in this structure and thus, a stress is moderated due to the deformation of this portion.

Moreover, as shown in FIG. 1, the electrode 15 is covered with the buffering layer 14 and the pedestal layer 16 is formed on the buffering layer 14. Therefore, any stress is not concentrated on the boundary between the electrode 15 made of a metal and the glass layer 12 and any crack does not occur in the package substrate 2 from the circumference of the electrode 15. Therefore, the electrode 15 is not broken. That is, the portion of the via 19 is not damaged.

The BGA-type semiconductor device of the embodiment 1 and its mounting structure, that is, an electronic apparatus have the following advantages.

(1) The electrode 15 provided for one side of the low-temperature co-fired ceramic multilayer substrate (package substrate) 2 is entirely covered with the buffering layer 14. Therefore, even if a thermal stress is applied to the joint 35 secured to the electrode 15, the buffering layer 14 absorbs the stress. Thus, any large stress does not work on the boundary between the electrode 15 and the glass layer 12 expanding around the electrode 15 and a portion nearby the boundary and a crack large enough to shave the glass layer 12 does not occur in the low-temperature co-fired ceramic multilayer substrate (package substrate) 2. As a result, the reliability of disconnection or mounting the electrode 15 is not deteriorated, and the reliability of mounting of a ball-grid-array-type semiconductor device is improved and the service life is improved. Moreover, the reliability of the electronic apparatus is improved.

(2) The pedestal layer 16 between the buffering layer 14 and the metallic ball 17 is formed into a shape in which its circumferential surface forms a circular-arc plane whose middle portion is recessed and its central portion is thinly constricted. Therefore, it is possible to decrease the maximum equivalent stress and prevent the joint from breaking.

(3) The metallic ball 17 is made of copper (oxygen-free copper) having a fusion point higher than that of the solder for forming the pedestal layer 16 and the buffering layer 14 and connected to the buffering layer 14 for covering the land 31 and the electrode 15 respectively through low-fusion-point solder. Therefore, the metallic ball 17 can keep its size, the BGA-type semiconductor device 1 is mounted on the mounting board 30 at a predetermined height, and a solder bridge caused by collapse of the joint 35 or a short circuit between electrodes does not occur.

(4) Because a metallic film such as a solder film having a high solder wettability, a rust prevention effect, and a fusion point higher than that of the solder for forming the pedestal layer 16 is formed on the surface of the metallic ball 17, secure solder mounting can be made at the time of mounting and the reliability of an electronic apparatus can be improved.

(5) The buffering layer 14 is formed with a solder layer of a non-eutectic ternary alloy obtained by adding antimony to solder made of lead and tin. Because antimony improves a liquid-phase temperature, it is possible to secure the metallic ball 17 to the buffering layer 14 by low-fusion-point solder (pedestal layer 16) without fusing the buffering layer 14 when fabricating the ball-grid-array-type semiconductor device 1. Moreover, because antimony does not fuse the buffering layer 14 when mounting the ball-grid-array-type semiconductor device 1 by low-fusion-point solder, it is possible to achieve secure mounting. Furthermore, because the buffering layer 14 is not fused, mutual diffusion does not occur.

(6) Antimony added to the buffering layer 14 makes it possible to prevent brittle fracture in a low-temperature region under a heat cycle test and the buffering layer 14 from breaking. Therefore, it is possible to improve the reliability of an electronic apparatus including the ball-grid-array-type semiconductor device 1.

(7) The pedestal layer 16 is a solder layer made of a non-eutectic quadruple alloy or non-eutectic ternary alloy made of lead and tin containing either or both of bismuth and silver. Bismuth and silver have an effect for improving the wettability of solder. Therefore, it is possible to form the pedestal layer 16 between the buffering layer 14 and the metallic ball 17 into a so-called waist shape, that is, a curved surface (circular-arc plane) in which the central portion is constricted and the circumferential surface is recessed and improve the disruptive strength of the joint 35 between the land 31 and the buffering layer 14 covering the electrode 15 because the maximum equivalent stress is improved.

(8) By adding bismuth and silver to the pedestal layer 16, it is possible to control the localization of lead phase and strength deterioration due to the localization under a heat cycle test and improve the reliability of mounting the ball-grid-array-type semiconductor device 1 on an electronic apparatus.

(9) Because the diameter of the metallic ball 17 increases up to 0.6 mm, the joint 35 between the land 31 and the buffering layer 14 covering the electrode 15 does not move even under a heat cycle test or disconnection of the electrode 15 does not occur. Therefore, the reliability of an electronic apparatus is improved and the service life of a built-in ball-grid-array-type semiconductor device is lengthened.

(10) When the buffering layer 14 is formed under fabrication of the ball-grid-array-type semiconductor device 1, the solder lump 41 is formed on each electrode 15 on the back of the package substrate 2 and then, the buffering layer 14 having a certain thickness is formed by pressing the solder lump 41 with the flat pressing plate (jig lid) 44 and heating the solder lump 41. In this case, the solder lump 41 is pressed by the jig 42 having a thermal expansion coefficient close to the thermal expansion coefficient of the low-temperature co-fired ceramic multilayer substrate. Therefore, any difference of expansion or shrinkage does not occur between the low-temperature co-fired ceramic multilayer substrate (package substrate) 2 and the jig lid 44 when temperature rises or lowers and thus, any stress in the direction displaced from the solder lump 41 does not occur. Therefore, it is possible to accurately form the buffering layer 14 for covering each electrode 15 on each electrode 15. This makes it possible to prevent a short circuit between electrodes and decrease the pitch between electrodes.

(11) To form the buffering layer 14 on each electrode 15 at one side of the package substrate 2 formed with a low-temperature co-fired ceramic multilayer substrate, the buffering layer 14 is formed by forming a glass layer (glass paste layer 26), then flattening the glass-layer forming plane of a not-sintered glass ceramic multilayer substrate, then sintering the glass ceramic multilayer substrate, forming the plated film 21 on each electrode surface, thereafter printing the high-fusion-point solder layer 40 on each electrode 15 more widely than the electrode surface and forming the spherical solder lump 41 on the electrode 15 by reflowing the high-fusion-point solder layer 40, and crushing the solder lump 41 by the jig 42 at a predetermined temperature. The crushed solder lump 41 smoothly spreads on the flat surface of the low-temperature co-fired ceramic multilayer substrate (package substrate) 2 without any obstacle and the buffering layer 14 securely covers every electrode 15 and it is formed at a predetermined thickness. Therefore, it is possible to accurately form the pedestal layer 16 on the buffering layer 14. Thereby, it is possible to form the securing state of the metallic ball 17 formed on the pedestal layer 16 at a high repeatability and form array-like external terminals 11 regularly arranged.

The invention made by the present inventor is specifically described above in accordance with the preferred embodiments. However, the present invention is not restricted to the embodiments. It is needless to say that various modifications can be made as long as they are not deviated from the gist of the present invention.

Advantages obtained from a typical invention among the inventions disclosed in this application are described below.

(1) A ball-grid-array-type semiconductor device has a structure in which a metallic ball is secured to an electrode provided for one side of a package substrate formed with a low-temperature co-fired ceramic multilayer substrate by a pedestal layer made of low-fusion-point solder. However, because the pedestal layer is formed on a buffering layer made of high-fusion-point solder for covering every electrode, any stress for mounting is not concentrated on the margin of electrodes. As a result, no crack occurs in the low-temperature co-fired ceramic multilayer substrate. Thus, it is possible to improve the reliability and the service life of the structure for mounting a ball-grid-array-type semiconductor device. As a result, it is possible to improve the reliability and the service life of an electronic apparatus including a ball-grid-array-type semiconductor device of the present invention. Moreover, it is possible to reduce the cost for fabrication of the electronic apparatus because the mounting yield is improved.

What is claimed is:

1. A ball grid array type semiconductor device including a package substrate consisting of a ceramic printed wiring board with a semiconductor chip mounting portion on the main side thereof and electrodes arranged in an array on the back side thereof a semiconductor chip fixed on the main side of the package substrate, a connecting means for electrically connecting the electrodes of the semiconductor chip and the wiring of the package substrate, a sealing body consisting of an insulating resin and provided on the main side of the package substrate for covering the semiconductor chip and the connecting means, a buffer layer consisting of high-melting point solder and provided on the electrodes, and metal balls fixed on the buffer layer via a pedestal layer consisting of low-melting point solder, the package substrate being formed of a low temperature sintered glass ceramic multilayer substrate, the buffer layer coating the entire surface of the electrodes with its periphery portion extended a prescribed distance to the back side of the package substrate, the overall size of the buffer layer being larger than that of the pedestal layer, the diameter of the metal-balls being smaller than the overall size of the pedestal layer, and the pedestal layer has a circular arc cross-section such that the diameter of the pedestal layer is larger in a junction with the buffer layer than that in a junction with the metal ball, and the peripheral contour is concurred in the intermediate portion thereof.

2. The ball grid array type semiconductor device according to claim 1, wherein the metal balls are formed of copper, silver, or high-melting point solder having a melting point higher than the solder which the pedestal layer or the buffer layer is formed of and, in cases where the metal balls are formed of copper or silver, the metal balls have a metal film, such as a solder film, having a high solder wettability, an anti-corrosive effect land a melting point higher than that of the solder which the pedestal layer is formed of formed on the surface thereof.

3. The ball grid array type semiconductor device according to claim 1, wherein the pedestal layer is a non-eutectic ternary alloy solder coat consisting of lead, tin and antimony.

4. The ball grid array type semiconductor device according to claim 1, wherein the pedestal layer is a no-eutectic ternary or quaternary alloy solder coat consisting of lead, tin, and either or of both or bismuth and silver.

5. The ball grid array type semiconductor device according to claim 1, wherein the diameter of the metal balls is larger than about 0.5 mm.

6. An electronic apparatus, comprising a ball grid array type semiconductor device which includes a package substrate consisting of a ceramic printed wiring board with a semiconductor chip mounting portion on the main side thereof and electrodes arranged in an array of the back side thereof, a semiconductor chip fixed on the main side of the package substrate, a connecting means for electrically connecting the electrodes of the semiconductor chip and the wiring of the package substrate, a sealing body consisting of an insulating resin and provided on the main side of the package substrate for covering the semiconductor chip and the connecting means, a buffer layer consisting of high-melting point solder and provided on the electrodes, and metal balls fixed on the buffer layer via a pedestal layer consisting of low-melting point solder; and a mounting substrate, and constructed in such a manner that the ball grid array type semiconductor device is fixed on the land of the mounting substrate via the metal ball through low-melting point solder, the package substrate being formed of a low temperature sintered glass ceramic multilayer substrate, the buffer layer coating the entire surface of the electrodes with its periphery portion extended a prescribed distance to the back side of the package substrate, the overall size of the buffer layer being larger than that of the pedestal layer, the diameter of the metal balls being smaller than the overall size of the pedestal layer, the diameter of the pedestal layer-buffer layer junction being larger than that of the pedestal layer-metal ball junction, and the periphery of the pedestal layer being a spherical surface having a dent in the middle thereof.

7. The electronic apparatus according to claim 6, wherein the metal balls are formed of copper, silver or high-melting point solder having a melting point higher than the solder which the pedestal layer or the buffer layer is formed of and, in cases where the metal balls are formed of copper or silver, the metal balls have a metal film, such as a solder film, having a high solder wettability, an anti-corrosive effect and a melting point higher than that of the solder which the pedestal layer is formed of formed on the surface thereof.

8. The electronic apparatus according to claim 6, wherein the buffer layer is a non-eutectic ternary alloy solder coat consisting of lead, tin and antimony.

9. The electronic apparatus according to claim 6, wherein the pedestal layer is a none-eutectic ternary or quaternary alloy solder coat consisting of lead, tin, and either of or both of bismuth and silver.

10. The electronic apparatus according to claim 6, wherein the diameter of the metal balls is larger than about 0.5 mm.

* * * * *